US011905491B2

(12) United States Patent
White et al.

(10) Patent No.: US 11,905,491 B2
(45) Date of Patent: Feb. 20, 2024

(54) POST CMP CLEANING COMPOSITIONS

(71) Applicant: Entegris, Inc., Billerica, MA (US)

(72) Inventors: Daniela White, Ridgefield, CT (US); YoungMin Kim, Suwon-si (KR); Michael L. White, Ridgefield, CT (US)

(73) Assignee: ENTEGRIS, INC., Billerica, MA (US)

( * ) Notice: Subject to any disclaimer, the term of this patent is extended or adjusted under 35 U.S.C. 154(b) by 204 days.

(21) Appl. No.: 17/492,257

(22) Filed: Oct. 1, 2021

(65) Prior Publication Data
US 2022/0106542 A1    Apr. 7, 2022

Related U.S. Application Data

(60) Provisional application No. 63/087,734, filed on Oct. 5, 2020.

(51) Int. Cl.
| | | |
|---|---|---|
| C11D 3/30 | (2006.01) | |
| C11D 11/00 | (2006.01) | |
| C11D 7/32 | (2006.01) | |
| C11D 7/26 | (2006.01) | |
| H01L 21/02 | (2006.01) | |
| C11D 7/34 | (2006.01) | |
| C11D 7/50 | (2006.01) | |

(52) U.S. Cl.
CPC .......... *C11D 11/0047* (2013.01); *C11D 7/263* (2013.01); *C11D 7/265* (2013.01); *C11D 7/267* (2013.01); *C11D 7/3218* (2013.01); *C11D 7/3281* (2013.01); *C11D 7/34* (2013.01); *C11D 7/5022* (2013.01); *H01L 21/02065* (2013.01)

(58) Field of Classification Search
CPC .................................................. C11D 11/0047
USPC .......................................................... 510/175
See application file for complete search history.

(56) References Cited

U.S. PATENT DOCUMENTS

| | | | |
|---|---|---|---|
| 8,765,653 B2 | 7/2014 | Tamboli | |
| 8,952,317 B2 | 2/2015 | Wunderer | |
| 9,074,170 B2 | 7/2015 | Barnes | |
| 10,109,523 B2 | 10/2018 | Chung | |
| 2010/0152086 A1 | 6/2010 | Wu | |
| 2013/0196893 A1 | 8/2013 | Busby | |
| 2016/0075971 A1* | 3/2016 | Liu | C11D 3/30 |
| | | | 510/175 |
| 2019/0136159 A1 | 5/2019 | Doyel | |
| 2019/0168265 A1 | 6/2019 | White | |
| 2020/0071642 A1 | 3/2020 | Thomas | |
| 2020/0148979 A1 | 5/2020 | White | |
| 2020/0181535 A1 | 6/2020 | Das | |
| 2020/0199500 A1 | 6/2020 | White | |

FOREIGN PATENT DOCUMENTS

| | | |
|---|---|---|
| WO | 2017148979 A1 | 9/2017 |
| WO | 2017156304 A1 | 9/2017 |
| WO | 2020018804 A1 | 1/2020 |

* cited by examiner

*Primary Examiner* — Gregory E Webb

(57) ABSTRACT

In general, the invention provides high pH cleaning compositions for dielectric surfaces such as PETEOS, $SiO_2$, thermal oxide, silicon nitride, silicon, etc. The compositions of the invention afford superior surface wetting, dispersion of particles and organic residues, and prevents redeposition and re-agglomeration of the dispersed residue during cleaning to afford superior cleaning and low defectivity.

19 Claims, 3 Drawing Sheets

POST CMP CLEANING COMPOSITIONS

FIELD OF THE INVENTION

The invention relates generally to compositions for removing post CMP residues from the surface of a microelectronic device.

BACKGROUND OF THE INVENTION

Microelectronic device wafers are used to form integrated circuits. The microelectronic device wafer includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is important to prepare a flat or planar microelectronic wafer surface prior to subsequent processing. Thus, it is necessary to remove and/or polish certain surfaces of a microelectronic device wafer.

Chemical Mechanical Polishing or Planarization ("CMP") is a process in which material is removed from a surface of a microelectronic device wafer, and the surface is polished (e.g., planarized) by coupling a physical process such as abrasion with a chemical process such as oxidation or chelation. In its most rudimentary form, CMP involves applying an abrasive slurry having an active chemistry to a polishing pad that buffs the surface of a microelectronic device wafer during the removal, planarization, and polishing processes. Removal or polishing processes using purely physical or purely chemical action are not as effective as the synergistic combination of both in order to achieve fast, uniform removal. In addition, in the fabrication of integrated circuits, the CMP slurry should also be able to preferentially remove films that comprise complex layers of metals and other materials so that highly planar surfaces can be produced for subsequent photolithography, or patterning, etching and thin-film processing.

In a front-end-of-the-line (FEOL) method for forming an isolation region in a silicon substrate using the shallow trench isolation (STI) process, a pad oxide film and a pad nitride film are deposited on a semiconductor substrate and patterned to expose portions of the substrate, which correspond to an isolation region. Then, the exposed regions of the substrate are etched to form a trench. Thereafter, the substrate is subjected to a sacrificial oxidation process to remove damage caused by the substrate etching followed by formation of a wall oxide film on the surface of the trench. Next, a trench-buried oxide film (e.g., an oxide film formed by high density plasma chemical vapor deposition referred to as an HDP-oxide film), is deposited on the surface of the substrate in such a manner as to be buried in the trench. Then, the surface of the HDP-oxide film is subjected to chemical mechanical polishing until the pad nitride film is exposed. The resulting substrate is then cleaned and the pad nitride film which was used as an etch barrier during the trench etch is removed, completing the formation of an isolation region.

A CMP slurry using ceria particles generally achieves a faster polishing speed for an insulator, relative to a silica-containing slurry. Moreover, a ceria-based slurry is most often used because of the ability to achieve STI pattern planarization with minimal oxide erosion. Disadvantageously, ceria-based slurries are difficult to remove from STI structures because of the oppositely charged zeta potentials of the ceria particles relative to the silicon oxide and silicon nitride surfaces. If a device is manufactured with these residues remaining on the wafer, the residues will lead to short circuits and an increase in electrical resistance. Ceria particles are also a problem with FinFET structures following CMP processing using ceria slurries.

Post CMP cleaning of dielectric substrates (PETEOS, $SiO_2$, thermal oxide, silicon nitride, silicon, etc.) polished with slurries containing silica and other metal oxides surface hydroxylated, as abrasive particles, is difficult and leads to high residue and defectivity due to the strong interactions between the abrasive particles and dielectric surfaces via hydrogen-bonding and Van der Waals forces at low and moderate pH and particle agglomeration and reprecipitation at high pH. In theory, at pH greater than the pH IEP (isoelectric point), both abrasive residual particles and the dielectric surfaces should be highly negatively charged and thus, the electrostatic repulsion particle-substrate should result in lower defectivity. In reality, most of the CMP slurries organic additives would prevent and neutralize these strong repulsive forces, sometimes contributing to the better adhesion of the particles to the wafer surface, an unwanted effect leading to high defectivity. Thus, a need exists for improved post CMP cleaning compositions which effectively remove both residual particles as well as those residues adhering to the dielectric wafer surface.

SUMMARY OF THE INVENTION

In general, the invention provides high pH cleaning compositions for dielectric surfaces such as PETEOS, $SiO_2$, thermal oxide, silicon nitride, silicon, etc. The compositions of the invention afford superior surface wetting, dispersion of particles and organic residues, and prevents redeposition and re-agglomeration of the dispersed residue during cleaning to afford superior cleaning and low defectivity. In one aspect, the invention provides a composition comprising:
 a. water;
 b. an alkanolamine having from two to seven carbon atoms;
 c. a glycol ether;
 d. a pH adjustor; and
 e. a surface-active hydrophobic acid.

DETAILED DESCRIPTION OF THE INVENTION

Figure 1:
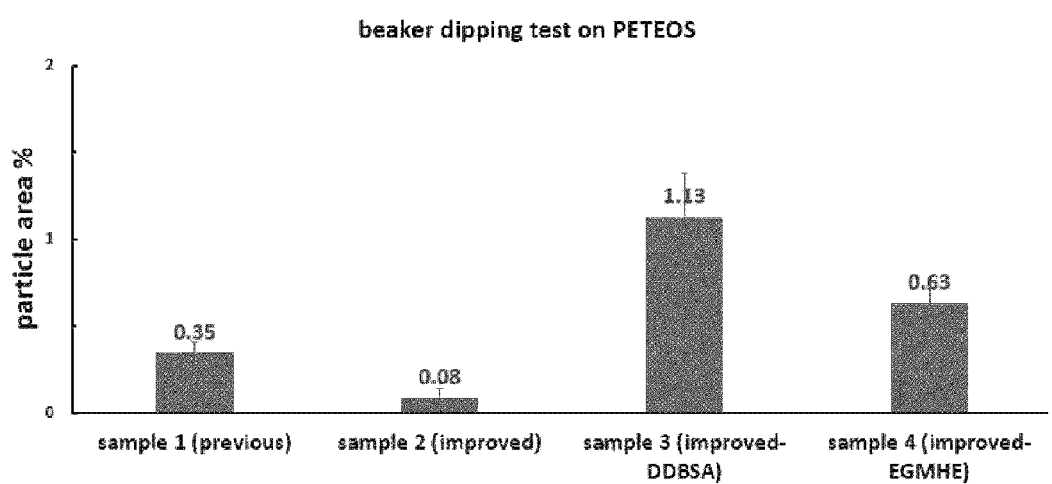
FIG. 1 is the particle area results of each formulations obtained by a particle counting program which is followed by a dipping test and SEM measurement, comparing Sample 1 (comparative) with Samples 2, 3, and 4.

The present invention relates generally to compositions useful for the removal of residue and contaminants from a microelectronic device having such material(s) thereon. The compositions are particularly useful for the removal of post-CMP, post-etch, or post-ash residue from dielectric surfaces such as PETEOS, $SiO_2$, thermal oxide, silicon nitride, silicon, etc.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g. 1 to 5 includes 1, 1.5, 2, 2.75, 3, 3.80, 4 and 5).

In a first aspect, the invention provides a composition comprising:
  a. water;
  b. an alkanolamine having from two to seven carbon atoms;
  c. a glycol ether;
  d. a pH adjustor; and
  e. a surface-active hydrophobic acid.

In one embodiment, the alkanolamine is chosen from aminoethylethanolamine, N-methylaminoethanol, aminoethoxyethanol, aminoethoxyethoxyethanol, methoxypropylamine, butoxyisopropylamine, 2-ethylhexylisopropoxyamine, ethanolpropylamine, ethylethanolamine, n-hydroxyethylmorpholine, aminopropyldiethanolamine, dimethylaminoethoxyethanol, diethanolamine, N-methyldiethanolamine, monoethanolamine, triethanolamine, 1-amino-2-propanol, 3-amino-1-propanol, diisopropylamine, aminomethylpropanediol, N,N-dimethylaminomethylpropanediol, aminoethylpropanediol, N,N-dimethylaminoethylpropanediol, isopropylamine, 2-amino-1-butanol, aminomethylpropanol, aminodimethylpropanol, N,N-dimethylaminomethylpropanol, isobutanolamine, diisopropanolamine, 3-amino, 4-hydroxyoctane, 2-aminobutylanol, tris(hydroxymethyl)aminomethane (TRIS), N,N-dimethyltris(hydroxymethyl)aminomethane, hydroxyproplyamine, benzylamine, hydroxyethyl amine, tris(hydroxyethyl)aminomethane, diglycolamine, and combinations thereof.

In one embodiment the glycol ether possesses a methylene linking group of the formula —$(CH_2)_x$—, wherein x is an integer of from 2 to 6, and optionally an aromatic group such as phenyl. In another embodiment, the glycol ether is chosen from diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (BDG, DEGBE), triethylene glycol monobutyl ether (TEGBE), ethylene glycol monohexyl ether (EGHE), diethylene glycol monohexyl ether (DEGHE), ethylene glycol phenyl ether, diethylene glycol phenylether, hexaethylene glycol monophenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether (such as DOWANOL™ PnB glycol ether, Dow, Inc.), dipropylene glycol n-butyl ether, tripropylene glycol n-butyl ether, dipropylene glycol phenyl ether, propylene glycol phenyl ether (such as DOWANOL™ PPh glycol phenyl ether).

In one embodiment, the pH adjustor is a base of a type and in an amount effective to increase the pH of the composition during use to a desired pH. In certain embodiments, the pH will be greater than 7, or between about 8 and 14, or between about 9 and 14.

The base can be any base that is useful for controlling pH of a composition, as specified, with many different basic compounds being known for use in cleaning solutions adapted to clean a surface of a microelectronic device substrate, e.g., as a post-CMP cleaning solution. Bases include, but are not limited to, potassium hydroxide, ammonium hydroxide (i.e., ammonia), and a tetraalkylammonium hydroxide compound having the formula $NR^1R^2R^3R^4OH$, wherein $R^1$, $R^2$, $R^3$ and $R^4$ may be the same as or different from one another and are chosen from hydrogen, straight-chain or branched $C_1$-$C_6$ alkyl (e.g., methyl, ethyl, propyl, butyl, pentyl, and hexyl) groups, $C_1$-$C_6$ hydroxyalkyl (e.g., hydroxymethyl, hydroxyethyl, hydroxypropyl, hydroxybutyl, hydroxypentyl, and hydroxyhexyl) groups, and substituted or unsubstituted $C_6$-$C_{10}$ aryl groups (e.g., benzyl groups). Non-limiting examples of basic compounds include: choline hydroxide, tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide, tetraethylammonium hydroxide (TEAH), tetrapropylammonium hydroxide (TPAH), tetrabutylammonium hydroxide (TBAH), trimethylethylammonium hydroxide, diethyldimethylammonium hydroxide, tributylmethylammonium hydroxide (TBMAH), benzyltrimethylammonium hydroxide (BTMAH), tetramethylammonium hydrochloride (TMAH), tris(2-hydroxyethyl)methyl ammonium hydroxide, diethyldimethylammonium hydroxide, guanidine acetate, ammonium hydroxide, 1,1,3,3-tetramethyl guanidine, guanidine carbonate, arginine, potassium hydroxide, cesium hydroxide and combinations thereof.

Alternatively or in addition, the pH adjustor may be a compound having the formula $(PR^5R^6R^7R^8)OH$, wherein $R^5$, $R^6$, $R^7$, and $R^8$ may be the same as or different from one another and are chosen from hydrogen, straight-chain $C_1$-$C_6$ alkyl (e.g., methyl, ethyl, propyl, butyl, pentyl, and hexyl) groups, branched $C_1$-$C_6$ alkyl groups, $C_1$-$C_6$ hydroxyalkyl (e.g., hydroxymethyl, hydroxyethyl, hydroxypropyl, hydroxybutyl, hydroxypentyl, and hydroxyhexyl) groups, substituted $C_6$-$C_{10}$ aryl groups, unsubstituted $C_6$-$C_{10}$ aryl groups (e.g., benzyl groups), and any combination thereof, such as tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide.

In another embodiment, pH adjustors (i.e., bases) are chosen from choline hydroxide and tetraethylammonium hydroxide (TEAH).

These basic compounds may be included separately (e.g., alone) as the only basic compound in a composition; in combination with each other in a composition, i.e., as the only two basic compounds in a composition; or in combination with one or more additional (e.g., secondary) base or bases in a composition.

The term "surface-active hydrophobic acid" as used herein, corresponds to acid species having hydrophobic groups, as readily understood by those skilled in the art, but do not include polymeric surfactants. Exemplary surface-active hydrophobic acids or salts, for use in the compositions described herein include sodium dodecylsulfate (SDS), decylphosphonic acid, dodecylphosphonic acid, tetradecylphosphonic acid, hexadecylphosphonic acid, bis(2-ethylhexyl)phosphate, octadecylphosphonic acid, perfluoroheptanoic acid, perfluorodecanoic acid, trifluoromethanesulfonic acid, phosphonoacetic acid, dodecylbenzenesulfonic acid, other benzene sulfonic acids or salts thereof, substituted by a group R', wherein R' is a straight-chained or branched $C_8$-$C_{18}$ alkyl group, myristylsulfonic acid, tridecylsulfonic acid, laurylsulfonic acid, decylsulfonic acid, undecylsulfonic acid, dodecenylsuccinic acid, dioctadecyl hydrogen phosphate, octadecyl dihydrogen phosphate, dodecenylsuccinic acid, lauric acid, butyric acid, pentanoic, hexanoic, heptanoic, palmitic acid, oleic acid, juniperic acid, 12-hydroxystearic acid, sodium lauryl sarcosinate, $C_1$-$C_6$ alkylarylphosphates, octadecylphosphonic acid, dodecyl phosphate, sodium lauryl sulfate, ammonium lauryl sulfate, potassium lauryl sulfate, bis-(2-ethylhexyl) sulfosuccinate, sodium lauryl sarcosinate, alkylarylphosphates, stearoyl sarcosine, stearic acid, arachidic acid, $C_{20}H_{40}O_2$, behenic acid, $C_{22}H_{44}O_2$, decanoic acid, $C_{10}H_{20}O_2$, 2-ethylhexanoic acid, $C_8H_{16}O_2$, heptadecanoic acid, $C_{17}H_{34}O_2$, heptanoic acid, $C_7H_{14}O_2$, heptatriacontanoic acid, $C_{37}H_{74}O_2$, hexanoic acid, $C_6H_{12}O_2$, hexatriacontanoic acid, $C_{36}H_{72}O_2$, lauric acid, $C_{12}H_{24}O_2$, melissic acid, $C_{30}H_{60}O_2$, 13-methyltetradecanoic acid, $C_{15}H_{30}O_2$, montanic acid, $C_{28}H_{56}O_2$, myristic acid, $C_{14}H_{28}O_2$, neodecanoic acid, $C_{10}H_{20}O_2$, nonacosylic acid, $C_{29}H_{58}O_2$, nonadecylic acid, $CH_3(CH_2)_{17}COOH$, nonanoic acid, $C_9H_{18}O_2$, palmitic acid, $C_{16}H_{32}O_2$, pentacosylic acid, $C_{25}H_{50}O_2$, pentadecanoic acid, $C_{15}H_{30}O_2$, phytanic acid, $C_{20}H_{40}O_2$, psyllic acid, $C_{33}H_{66}O_2$, stearic acid, $C_{18}H_{36}O_2$, tetratriacontanoic acid, $C_{34}H_{68}O_2$, tricosylic acid, $C_{23}H_{46}O_2$, tridecylic acid, $C_{13}H_{26}O_2$, tuberculostearic acid, $C_{19}H_{38}O_2$, undecylic acid, $C_{11}H_{22}O_2$, octanoic acid, sebacic acid, and suberic acid.

In one embodiment, the surface-active hydrophobic acid is chosen from octanoic acid, dodecylbenzenesulfonic acid, and nonanoic acid.

In one embodiment, the composition further comprises a corrosion inhibitor. Illustrative corrosion inhibitors include, but are not limited to, phosphorous acid, hypophosphorous acid, sulfurous acid, diethyl hydroxylamine, hydroxylamine sulfate, sodium metabisulfite, potassium metabisulfite, ammonium metabisulfite, quaternary surfactants chosen from as N-alkyl-N-benzyl-N,N-dimethylammonium chloride, and 4-(3-phenylpropyl)pyridine, acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, succinic acid, tartaric acid, terephthalic acid, trimellitic acid, trimesic acid, tyrosine, valine, xylitol, oxalic acid, tannic acid, picolinic acid, 1,3-cyclopentanedione, catechol, pyrogallol, resorcinol, hydroquinone, cyanuric acid, barbituric acid, 1,2-dimethylbarbituric acid, pyruvic acid, propanethiol, benzohydroxamic acids, 2,5-dicarboxypryidine, 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid (CDTA), N-(hydroxyethyl)-ethylenediaminetriacetic acid (HEdTA), iminodiacetic acid (IDA), 2-(hydroxyethyl)iminodiacetic acid (HIDA), nitrilotriacetic acid, thiourea, 1,1, 3,3-tetramethylurea, urea, urea derivatives, glycine, cysteine, glutamic acid, isoleucine, methionine, piperadine, N-(2-aminoethyl) piperadine, pyrrolidine, threonine, tryptophan, salicylic acid, p-toluenesulfonic acid, salicylhyroxyamic, 5-sulfosalicylic acid, triazole, aminotriazole, dimethylpropargyl alcohol, saccharine, and combinations thereof.

In another embodiment, the corrosion inhibitor is a compound which serves as a reducing agent. Exemplary compounds include, but are not limited to, ascorbic acid, L(+)-ascorbic acid, isoascorbic acid, ascorbic acid derivatives, sulfurous acid, ammonium sulfite, potassium sulfite, sodium sulfite, dopamine HCl, phosphorous acid, phosphinic acid, hypophosphorous acid, potassium metabisulfite, sodium metabisulfite, ammonium metabisulfite, potassium pyruvate, sodium pyruvate, ammonium pyruvate, formic acid, sodium formate, potassium formate, ammonium formate, dopamine, sulfur dioxide solution, and any combination thereof. For example, the corrosion inhibitor/reducing agent may comprise at least one sulfite ion and at least one other enumerated reducing agent, for example, sulfurous acid, potassium sulfite, ammonium sulfite, phosphinic acid, diethyl hydroxylamine sulfate, diethyl hydroxylamine phosphate, and any combination thereof. It is to be appreciated that when ammonium sulfite is present, the ammonium sulfite can be produced in situ, wherein the combination of specific components results in the formation of ammonium sulfite to assist with the removal of residue.

In another embodiment, the corrosion inhibitor is chosen from ascorbic acid, phosphorous acid, hypophosphorous acid, sulfurous acid, diethyl hydroxylamine, hydroxylamine sulfate, sodium/ammonium/potassium metabisulfite and sulfite and quaternary surfactants including N-Alkyl-N-benzyl-N,N-dimethylammonium chloride (benzalkonium chloride) and 4-(3-phenylpropyl)pyridine.

In various embodiments, when present, the amount of corrosion inhibitor in the composition is in the range of from about 0.0001 wt % to about 1 wt % based on the total weight of the composition. In another embodiment, the reducing agent is present in an amount of from about 0.0001 wt % to about 0.2 wt %, based on the total weight of the composition, and, in another embodiment in an amount of from about 0.01 wt % to about 0.2 wt %. In certain embodiments, the cleaning composition does not contain a corrosion inhibitor/reducing agent.

In other embodiments, the composition comprises compounds which function as hydrogen bonding additives, which serve to reduce silica particles from sticking to brushes utilized in the cleaning of post-CMP microelectronic devices. See, for example, U.S. Patent Publication No. 2019/0168265, incorporated herein by reference. Exemplary compounds include non-ionic, anionic, cationic, and zwitterionic small molecules and polymers that may behave as a polyelectrolyte at neutral pH. Anionic polymers or anionic polyelectrolytes can be natural, modified natural polymers, or synthetic polymers. Exemplary natural and modified natural anionic polymers that can be included in the composition include, but are not limited to: alginic acid (or salts), carboxymethylcellulose, dextran sulfate, poly(galacturonic acid), and salts thereof. Exemplary synthetic anionic polyelectrolytes include, but are not limited to: homopolymers or copolymers of (meth)acrylic acid (or salts), poly(acrylic acid), maleic acid (or anhydride), styrene sulfonic acid (or salts), vinyl sulfonic acid (or salts), allyl sulfonic acid (or salts), acrylamidopropyl sulfonic acid (or salts), and the like, wherein the salts of the carboxylic acid and sulfonic acids are preferably neutralized with an ammonium or alkylammonium cation. In one embodiment, cations of a polyelectrolyte anionic polymer are ammonium cations ($NH_4^+$), cholinium$^+N(CH_3)_3(CH_2CH_2OH)$ and $^+N(CH_3)_4$. Thus, examples of combined synthetic and natural polyelectrolyte anionic polymers are homopolymers or copolymers of (meth)acrylic acid, maleic acid (or anhydride), styrene sulfonic acid, vinyl sulfonic acid, allyl sulfonic acid, vinylphosphonic acid, acrylamidopropyl sulfonic acid, alginic acid, carboxymethylcellulose, dextran sulfate, poly(galacturonic acid), and salts thereof.

Cationic polymers and cationic polyelectrolytes can be natural, modified natural polymers, or synthetic polymers. Exemplary natural and modified natural cationic polymers include, but are not limited to: chitosan, cationic starch, polylysine, and salts thereof. Exemplary cationic synthetic polyelectrolytes include but are not limited to: homopolymers or copolymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl(meth)acrylate acid addition salts and quaternary salts, N,N'-dimethylaminopropyl acrylamide acid addition salts and quaternized salts, wherein the quaternary salts include alkyl and benzyl quaternized salts; allylamine, diallylamine, vinylamine (obtained by hydrolysis of vinyl alkylamide polymers), vinyl pyridine, chitosan, cationic starch, polylysine, and salts thereof.

Other examples include 2-pyrrolidinone, 1-(2-hydroxyethyl)-2-pyrrolidinone (HEP), glycerol, 1,4-butanediol, tetramethylene sulfone (sulfolane), dimethyl sulfone, ethylene glycol, propylene glycol, dipropylene glycol, tetraglyme, and diglyme.

Alternatively, or in addition, the hydrogen bonding additives include hydroxypropylcellulose, hydroxyethylcellulose, hydroxyethylmethyl cellulose, hydroxyproplymethyl cellulose, carboxymethylcellulose, sodium carboxymethylcellulose, polyvinylpyrrolidone (PVP), any polymer made using the N-vinyl pyrrolidone monomer, polyacrylic acid esters and analogues of polyacrylic acid esters, polyaminoacids (e.g., polyalanine, polyleucine, polyglycine), polyamidohydroxyurethanes, polylactones, polyacrylamide, Xanthan gum, chitosan, polyethylene oxide, polyvinyl alcohol (PVA), polyvinyl acetate, polyacrylic acid, polyethyleneimine, sugar alcohols such as sorbitol, sucrose, fructose, lactose, galactose, maltose, erythritol, maltitol, threitol, arabinol, ribitol, mannitol, galactitol, inositol, and xylitol, esters of anhydrosorbitols, secondary alcohol ethoxylates such as TERGITOL™ surfactants, multifunctional alcohols including pentaerytritol, dipentaerythitol, trimethylolpropane, dimethylpropionic acid, and xylonic acid, nucleobases such as uracil, cytosine, guanine, thymine, and combinations thereof.

Still other examples of hydrogen bonding additives include lactic acid, maleic acid, urea, glycolic acid, sorbitol, borax (i.e., sodium borate), proline, a betaine, glycine, histidine, TRIS (tris(hydroxymethyl)aminomethane), dimethyl sulfoxide, sulfolane, glycerol, SDS (sodium dodecyl sulfate), dodecylphosphonic acid, or a combination thereof. In one of these, certain particle removal agents may be preferred for use in post-CMP cleaning steps for microelectronic device substrates, e.g.: maleic acid, borax (i.e., sodium borate), dimethyl sulfoxide, glycerol, or a combination thereof. When present, such additives will be present in about 0.0001 to 15 weight percent, or about 0.001 to about 10 weight percent, about 1 to about 10 weight percent, or about 1 to about 9 weight percent.

In one embodiment, the composition further comprises a complexing agent. In general, a complexing agent used in a post-CMP cleaning composition is a chemical compound that forms a complex molecule, typically with a metal ion, often an iron ion, to inactivate the ion within the cleaning solution and prevent chemical reaction or activity by the ion. Various complexing agents are known for use in post-CMP cleaning compositions and can be used in a cleaning composition and method of the present description. Certain specific examples include acid-containing organic molecules, especially carboxylic acid-containing organic molecules such as linear or branched $C_1$-$C_6$ carboxylic acid compounds that include phthalic acid, succinic acid, citric acid, tartaric acid, malic acid, gluconic acid, aspartic acid, or a combination thereof, as well as, glycine, amino acids and the like. Citric acid can be a preferred complexing agent for complexing iron ions (e.g., $Fe^{+2}$, $Fe^{+3}$). In certain embodiments, sugar alcohols such as: arabitol, erythritol, glycerol, hydrogenated starch hydrolysates (HSH), isomalt, lactitol, maltitol, mannitol, sorbitol, and xylitol are utilized as complexing reagents for metal ions.

Other metal complexing reagents contemplated herein include, but are not limited to, acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, ethylenediamine, oxalic acid, tannic acid, picolinic acid, 1,3-cyclopentanedione, catechol, pyrogallol, resorcinol, hydroquinone, cyanuric acid, barbituric acid, 1,2-dimethylbarbituric acid, pyruvic acid, propanethiol, benzohydroxamic acids, tetraethylenepentamine (TEPA), 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid (CDTA), N-(hydroxyethyl)-ethylenediaminetriacetic acid (HEdTA), iminodiacetic acid (IDA), 2-(hydroxyethyl)iminodiacetic acid (HIDA), nitrilotriacetic acid, amino tris (methylene phosphoric acid), hydroxyethylidine diphosphonic acid, ethylenediamino tetrakis(methylene phosphoric acid), ethylenediamino pentakis(methylene phosphoric acid), thiourea, 1,1,3,3-tetramethylurea, urea, urea derivatives, glycine, cysteine, glutamic acid, isoleucine, methionine, piperadine, N-(2-aminoethyl) piperadine, pyrrolidine, threonine, tryptophan, salicylic acid, dipicolinic acid, p-toluenesulfonic acid, 5-sulfosalicylic acid, and combinations thereof.

Other examples of useful complexing agents include carboxylic acid group-containing oligomers and polymers derived from monomers that may include one or more of acrylic acid, methacrylic acid, maleic acid, succinic acid, aspartic acid, 2-acrylamido-2-methyl-1-propanesulfonic, acrylamide, phosphonate methacrylamidopropyl trimethylammonium chloride, allyl halide, or a combination thereof. Polyacrylic acid can be a preferred complexing agent for complexing silica nitride (SiN). Still other examples include: propane-1,2,3-tricarboxylic acid, butane-1,2,3,4-tetracarboxylic acid, pentane-1,2,3,4,5-pentacarboxylic acid, trimellitic acid, trimesinic acid, pyromellitic acid, mellitic acid, and combinations of thereof.

Generally, a complexing agent can be included in a cleaning solution in an amount useful to be effective in a manner described herein for a complexing agent. Particular types and amounts of complexing agent that are included in a given cleaning solution can be selected based on factors that include the type of substrate being cleaned, the type of residue present at the substrate surface, other ingredients in the cleaning solution, and the conditions of a post-CMP cleaning process. When present, the complexing agents are utilized in about 0.5 to about 20 weight percent, about 0.5 to about 10 weight percent, or about 0.8 to about 6 weight percent.

The cleaning composition of the invention may further comprise other ingredients or adjuvants, including polymers and surfactants, to improve the cleaning effect or efficiency of a post-CMP cleaning step using the cleaning solution. Such ingredients include surfactants and biocides.

Exemplary surfactants and polymers include anionic, non-ionic, cationic and/or zwitterionic surfactants. When present, such surfactants and polymers will be present in amounts of about 0.0001 to about 10 weight percent. Examples include alginic acid and salts thereof; hydroxyl or carboxyalkylcellulose; dextran sulfate and salts thereof; poly(galacturonic acid) and salts thereof; homopolymers of (meth)acrylic acid and salts thereof, maleic acid, maleic acid anhydride, styrene sulfonic acid and salts thereof, vinyl sulfonic acid and salts thereof, allyl sulfonic acid and salts thereof, acrylamidopropyl sulfonic acid and salts thereof; copolymers of (meth)acrylic acid and salts thereof, maleic acid, maleic acid anhydride, styrene sulfonic acid and salts thereof, vinyl sulfonic acid and salts thereof, allyl sulfonic acid and salts thereof, acrylamidopropyl sulfonic acid and salts thereof; chitosan; cationic starch; polylysine and salts thereof; homopolymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl(meth)acrylate acid addition salts and quaternary salts, N,N'-dimethylaminopropyl acrylamide acid addition salts and quaternary salts, allylamine, diallylamine, vinylamine, vinyl pyridine; and co-polymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl(meth)acrylate acid addition salts and quaternary salts, N,N'-dimethylaminopropyl acrylamide acid addition salts and quaternary salts, allylamine, diallylamine, vinylamine, vinyl pyridine; cocodimethylcarboxymethylbetaine; lauryldimethylcarboxymethylbetaine; lauryldimethyl-alpha-carboxyethylbetaine; cetyldimethylcarboxymethylbetaine; lauryl-bis-(2-hydroxyethyl)carboxymethylbetaine; stearyl-bis-(2-hydroxypropyl) carboxymethylbetaine; oleyldimethyl-gamma-carboxypropylbetaine; lauryl-bis-(2-hydroxypropyl)alpha-carboxyethylebetaine; cocodimethylsulfopropylbetaine; stearyldimethylsulfopropylbetaine; lauryl-bis-(2-hydroxyethyl)sulfopropylbetaine; Surfynol 104, (and ethoxylated derivatives thereof); dioctyl sulfosuccinate sodium salt; sodium lauryl ether sulfate; polyethylene glycol branched-nonylphenyl ether sulfate ammonium salt; disodium 2-dodecyl-3-(2-sulfonatophenoxy); PEG25-PABA; polyethylene glycol mono-C10-16-alkyl ether sulfate sodium salt; (2-N-butoxyethoxy)acetic acid; hexadecylbenzene sulfonic acid; cetyltrimethylammonium hydroxide; dodecyltrimethylammonium hydroxide; dodecyltrimethyl ammonium chloride; cetyltrimethyl ammonium chloride; N-Alkyl-N-benzyl-N,N-dimethylammonium chloride; dodecylamine; polyoxyethylene lauryl ether; dodecenylsuccinic acid monodiethanol amide; ethylenediamine tetrakis(ethoxylate-block-propoxylate); and combinations thereof.

In a further embodiment, the composition further comprises a water-soluble or water-dispersible polymer. Such polymers, when present, include, but are not limited to, methacrylic acid homopolymer and copolymers with, acrylamidomethylpropane sulfonic acid and maleic acid; maleic acid/vinyl ether copolymer; poly(vinylpyrrolidone)/vinyl acetate; phosphonated polyethyleneglycol oligomers, poly (acrylic acid), poly(acrylamide), poly(vinyl acetate), poly (ethylene glycol), polypropylene glycol), poly(styrene sulfonic acid), poly(vinyl sulfonic acid), poly(vinyl phosphonic acid), poly(vinyl phosphoric acid), poly(ethyleneimine), poly(propyleneimine), polyallylamine, polyethylene oxide, polyvinyl pyrrolidone, PPG-PEG-PPG block copolymers, PEG-PPG-PEG block copolymers, poly(vinyl alcohol), poly (hydroxyethyl)acrylate, poly(hydroxyethyl)methacrylate, hydroxyethyl cellulose, methylhydroxyethyl cellulose, hydroxypropyl cellulose, methylhydroxypropyl cellulose, xanthan gum, potassium alginate, pectin, carboxymethylcellulose, glucosamine, poly(diallyldimethylammonium) chloride, poly(2-acrylamido-2-methyl-1-propanesulfonic acid), poly(styrenesulfonic acid), polyvinyl pyrrolidone, PVA-poly (2-acrylamido-2-methyl-1-propanesulfonic acid) copolymers, polyethyleneglycolated) methacrylate/acrylate copolymers, poly(2-methacryloxyethyltrimethylammonium chloride) CAS Number 26161-33-1, and copolymers thereof, dimethylaminomethacrylate polymers and copolymers thereof, trimethylammonium methylmethacrylate polymers and copolymers thereof, dimethylaminomethacrylate polymers and copolymers thereof, trimethylammonium methylmethacrylate polymers and copolymers thereof, and combinations thereof. The copolymers above may be random or block copolymers. When present, the amount of polymer(s) in the composition is in a range from about 0.0001 weight % to about 5 weight %, based on the total weight of the composition.

Exemplary biocides contemplated herein include, but are not limited to, isothiazolinone biocides such as 5-chloro-2-methyl-4-isothiazolin-3-one, 2-methyl-4-isothiazolin-3-one, benzisothiazolone, 1,2-benzisothiazol-3[2H]-one, methylisothiazolinone, methylchloroisothiazolinone, and combinations thereof. In one embodiment, the biocide can include. One example of a biocide is Proxel® GXL (BIT) 1,2-benzoisothiazol-3(2H)-one.

In certain embodiments, the components of the composition are present in the following proportions:
a. 60-80 weight percent of water, for example deionized water;
b. 0.1-20 weight percent of an alkanolamine having from two to seven carbon atoms; or 0.1 to 10 weight percent, or 1 to 6 weight percent;
c. 0.01-30 weight percent of a glycol ether; or 1 to 15 weight percent, or 1 to 10 weight percent;
d. 0.001-10 weight percent of a pH adjustor;
e. 0.00001-10 weight percent, or 0.0001-8 weight percent, or 0.005 to 5 weight percent, of a surface-active hydrophobic acid; with the total of a., b., c., d., and e. being 100 percent.

The amount of the pH adjusting agent is dependent on the final pH sought when preparing the removal composition for use, based on the pH values disclosed herein, and the knowledge of the person skilled in the art. In certain embodiments, the pH will be greater than 7, or between about 8 and 14, or between about 9 and 14.

The range of weight percent ratios of the components will cover all possible concentrated or diluted embodiments of the composition. To that end, in one embodiment, a concentrated composition is provided that can be diluted for use as a cleaning solution. A concentrated composition, or "concentrate," advantageously permits a user (e.g., a CMP process engineer) to dilute the concentrate to the desired strength and pH at the point of use. Dilution of the concentrated aqueous removal composition may be in a range from about 1:1 to about 2500:1, about 5:1 to about 200:1, or about 20:1 to about 120:1, wherein the aqueous removal composition is diluted at or just before the tool with solvent, e.g., deionized water. It is to be appreciated by one skilled in the art that following dilution, the range of weight percent ratios of the components disclosed herein should remain unchanged.

According to certain example cleaning solutions in concentrated form, before dilution to a point of use composition, in certain embodiments, the composition can be a concentrate of up to 20%, or in the range of 0.5 to 10%, or 0.8 to 6%.

The compositions described herein may have utility in applications including, but not limited to, post-etch residue removal, post-ash residue removal surface preparation, post-plating cleaning and post-CMP residue removal. In addition, it is contemplated that the cleaning compositions described herein may be useful for the cleaning and protection of other metal (e.g., copper-containing, tungsten-containing, ruthenium-containing, cobalt-containing) products including, but not limited to, decorative metals, metal wire bonding, printed circuit boards and other electronic packaging using metal or metal alloys, along with dielectric materials such as plasma enhanced tetraethylorthosilicate (PETEOS), silicon nitride, silicon oxynitride, silicon carbide, CVD carbon, porous organosilicate glass, CSOD, diamond-like carbon, silsesquioxane-based dielectrics such as hydrogen silsesquioxane (HSQ) and methylsilsesquioxane (MSQ), silicon, BPSG, and HDP.

The removal compositions are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect relates to a kit comprising one or more containers having components therein suitable for removing A kit comprising one or more containers having components therein suitable for removing ceria particles and chemical mechanical polishing contaminants from a microelectronic device having said particles and contaminants thereon, wherein one or more containers of said kit contains composition comprising:
a. water;
b. an alkanolamine having from two to seven carbon atoms;
c. a glycol ether;
d. a pH adjustor; and
e. a surface-active hydrophobic acid.

The containers of the kit must be suitable for storing and shipping the compositions and may be, for example, NOWPak® containers (Entegris, Inc., Billerica, Mass., USA).

In one embodiment, the one or more containers which contain the components of the composition include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, in certain embodiments the system includes a dispensing port for dispensing the blended removal composition to a process tool.

As applied to microelectronic manufacturing operations, the removal compositions described herein are usefully employed to clean residues and/or CMP contaminants (e.g., post-CMP residue and contaminants) from the surface of the microelectronic device. The removal compositions do not damage low-k dielectric materials (e.g., silicon oxide), silicon nitride layers, or tungsten-containing layers on the device surface. In one embodiment, the aqueous removal compositions remove at least 85% of the abrasive particles present on the device prior to particle removal, at least 90%, at least 95%, or at least 99%.

Accordingly, in a further aspect, the invention provides a method for removing residues and/or contaminants from a microelectronic device having said residues and contaminants thereon, said method comprising: (i) contacting the microelectronic device with the compositions of the invention; and (ii) at least partially removing said particles and contaminants from said microelectronic device, wherein said microelectronic device comprises a substrate chosen from copper-containing, tungsten-containing, ruthenium-containing, cobalt-containing products including, but not limited to, decorative metals, metal wire bonding, printed circuit boards and other electronic packaging using metal or metal alloys, along with dielectric materials such as plasma enhanced tetraethylorthosilicate (PETEOS), silicon nitride, silicon oxynitride, silicon carbide, CVD carbon, porous organosilicate glass, CSOD, diamond-like carbon, silsesquioxane-based dielectrics such as hydrogen silsesquioxane (HSQ) and methylsilsesquioxane (MSQ), silicon, BPSG, and HDP.

In post-CMP particle and contaminant removal applications, the aqueous removal composition described herein may be used with a large variety of conventional cleaning tools such as megasonics and brush scrubbing, including, but not limited to, Verteq single wafer megasonic Goldfinger, OnTrak systems DDS (double-sided scrubbers), SEZ or other single wafer spray rinse, Applied Materials Mirra-Mesa™/Reflexion™/Reflexion LK™, Megasonic batch wet bench systems, EBARA Technologies, Inc. 300 mm models (FREX300S2 and FREX300X3SC) and 200 mm CMP system (FREX200M).

In the use of the compositions described herein for removing residues and/or contaminants from microelectronic devices having same thereon, the aqueous removal composition typically is contacted with the device for a time of from about 5 seconds to about 10 minutes, or about 1 sec to 20 min, or about 15 sec to about 5 minutes at temperature in a range of from about 20° C. to about 90° C., or about 20° C. to about 50° C. Such contacting times and temperatures are illustrative, and any other suitable time and temperature conditions may be employed that are efficacious to at least partially remove the residues and/or contaminants from the device, within the broad practice of the method. "At least partially clean" and "substantial removal" both correspond in certain embodiments to at removal of at least 85% of the residues and/or contaminants present on the device prior to particle removal, at least 90%, at least 95%, or at least 99%.

Following the achievement of the desired particle removal action, the aqueous removal composition may be readily removed from the device to which it has previously been applied, as may be desired and efficacious in a given end use application of the compositions described herein. In one embodiment, the rinse solution includes deionized water. Thereafter, the device may be dried using nitrogen or a spin-dry cycle.

Yet another aspect relates to the improved microelectronic devices made according to the methods described herein and to products containing such microelectronic devices.

Another aspect relates to a recycled aqueous removal composition, wherein the removal composition may be recycled until residue and/or contaminant loading reaches the maximum amount the aqueous removal composition may accommodate, as readily determined by one skilled in the art.

A still further aspect relates to methods of manufacturing an article comprising a microelectronic device, said method comprising contacting the microelectronic device with the composition of the invention for sufficient time to remove residues and/or contaminants from the microelectronic device having said residues and/or contaminants thereon, and incorporating said microelectronic device into said article, using a composition described herein.

This invention can be further illustrated by the following examples of preferred embodiments thereof, although it will be understood that these examples are included merely for purposes of illustration and are not intended to limit the scope of the invention unless otherwise specifically indicated.

EXAMPLES

Referring to FIG. 1, samples 1, 2, 3 and 4 were prepared and subjected to a beaker dipping test on PETEOS. In general, the procedure involved exposing a test wafer to a contaminated slurry for about 5 minutes at room temperature with magnetic stirring bar at 100 rpm. Next the wafer was placed in a composition of the invention at room temperature for about 30 seconds with a magnetic stirring bar at 550 rpm. The wafer was then rinsed with deionized water for about 20 seconds in a third beaker, followed by blow drying with dry nitrogen. After dipping test, the wafer samples were screened through SEM measurement and particle counting program to convert and compare the cleaning performance by number-based graph.

As shown in FIG. 1, with Sample 1 serving as the Comparative example, the compositions of the invention showed significant residue removal results Sample 1

| Blend Order | Raw Materials | CAS No. | Solvent (if any as solution) | Raw assay weight % | Add Weight % | Comp weight % |
|---|---|---|---|---|---|---|
| 1 | Deionized water | 7732-18-5 | — | | 77.24 | 81.77 |
| 2 | Monoethanolamine | 141-43-5 | | 100 | 4.50 | 4.5 |
| 3 | PAA (MW~2,000) | 9003-01-04 | $H_2O$ | 50.0 | 1.00 | 0.50 |
| 4 | D-sorbitol | 50-70-4 | | 100.0 | 6.00 | 6.00 |
| 5 | Ascorbic acid | 50-81-7 | | 100.0 | 3.67 | 3.67 |
| 6 | Proxel GXL (BIT) 1,2-Benzoisotriazol-3(2H)-one | 2634-33-5 | | 100 | 0.008 | 0.008 |
| 7 | Choline hydroxide (XHE-112) | 123-41-1 | $H_2O$ | 46.8 | 7.59 | 3.55 |
| | | | Sum | | 100 | 100 |

Sample 2:

| Blend Order | Raw Materials | CAS No. |
|---|---|---|
| 1 | Deionized water | 7732-18-5 |
| 1 (G2) | 1-amino-2-propanol | 78-96-6 |
| 3(E4) | Ethylene glycol monohexyl ether | 112-25-4 |
| 4 (M3) | 4-dodecylbenzenesulfonic acid | 121-65-3 |
| 5 (A) | Choline hydroxide (XHE-112) | 123-41-1 |
| 6 | Ascorbic acid | 50-81-7 |
| 7 | D-sorbitol | 50-70-4 |
| 8 | Proxel ® GXL (BIT) 1,2-benzoisothiazol-3(2H)-one | 2634-33-5 |

Sample 3 is the same as example 2, except 4-dodecylbenzenesulfonic acid is omitted.

Sample 4 is the same as example 2, except ethylene glycol monohexyl ether is omitted.

| | | TEOS | |
|---|---|---|---|
| Number | Sample | Area | Standard Deviation |
| 1 | sample 1 (comparative) | 0.35 | 0.06 |
| 2 | sample 2 (improved) | 0.08 | 0.05 |
| 3 | sample 3 (improved-DDBSA) | 1.13 | 0.25 |
| 4 | sample 4 (improved-EGMHE) | 0.63 | 0.08 |

| | | Surface tension (mN/m) | | |
|---|---|---|---|---|
| Number | Sample | Average | deviation | WCA(°) |
| 1 | sample 1 (comparative) | 62.16 | 0.31 | 6.3 |
| 2 | sample 2 (improved) | 23.93 | 0.15 | 7.1 |

Figure 2:
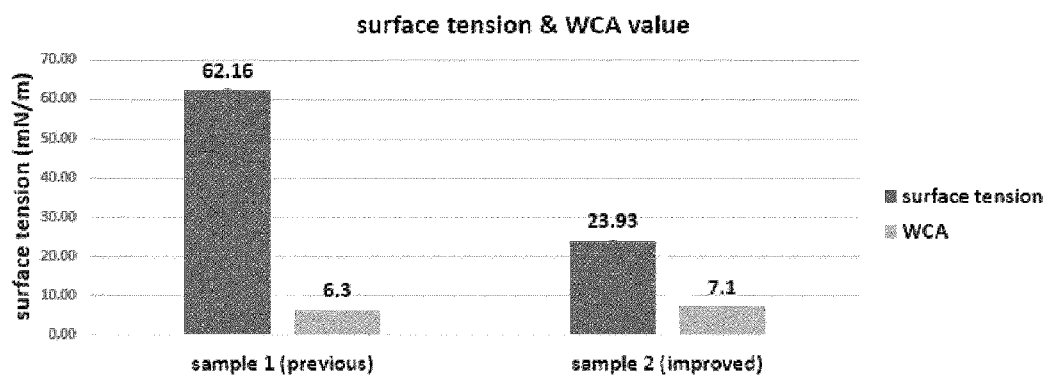
FIG. 2 is a surface tension and water contact angle (WCA) of Sample 1 (comparative) and the improved compositions of the invention.

FIG. 2 is surface tension and water contact angle (WCA) of Sample 1 (comparative) and an improved formulation. The newly introduced newly introduced surface-active hydrophobic acid of sample 2 illustrates the reduction of surface tension to aid in the cleaning effect of the wafer.

Sample X Series:

| Blend order | Raw Materials | CAS No. |
|---|---|---|
| 1 | Deionized water | 7732-18-5 |
| 2 | Monoethanolamine | 141-43-5 |
| 3 | *Surfactant additives (see table below) | |
| 4 | Diethylene glycol monobutyl ether | 112-34-5 |
| 5 | D-sorbitol | 50-70-4 |
| 6 | Proxel GXL (BIT) 1,2-benzoizotiazol-3(2H)-one | 2634-33-5 |
| 7 | Choline hydroxide | 123-41-1 |

| *Surface active additives | CAS No. | Cleaner sample no. |
|---|---|---|
| Butyric acid | 107-92-6 | Sample X BA |
| Octanoic acid | 124-07-2 | Sample X OA |
| Nonanoic acid | 112-05-0 | Sample X NA |
| Decanoic acid | 334-48-5 | Sample X DA |
| Sebacic acid | 111-20-6 | Sample X SA |
| Suberic acid | 505-48-6 | Sample X SBA |
| Citric acid - (comparative) | 77-92-9 | Sample X CA |

Figure 3:
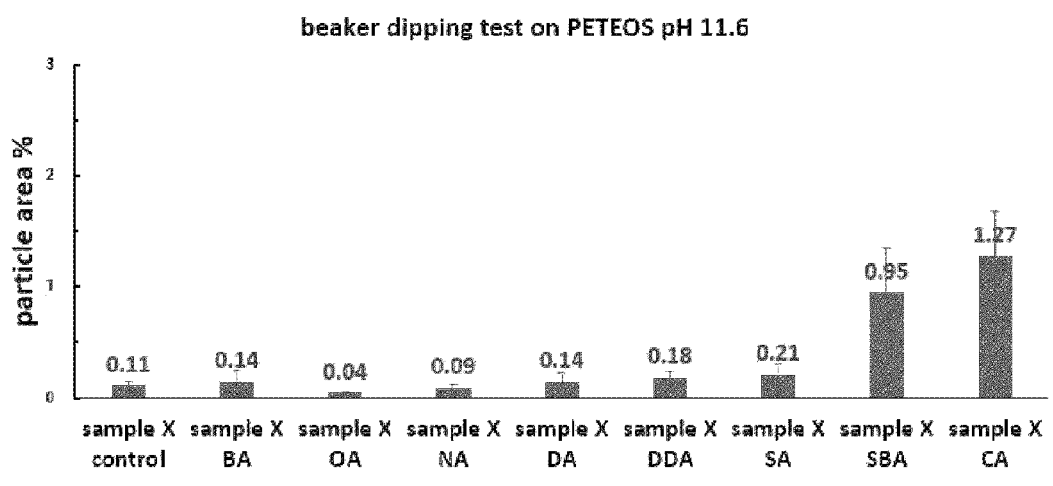
FIG. 3 illustrates the particle area results of the series of various compositions.

FIG. 3 is the particle area results of the series of various surface-active additives for the compare of cleaning effect of formulations. Each formulation has the different character of surface-active additives such as alkyl chain length or numbers of functional groups to see most effective structure for cleaning the wafer. The sample X OA and sample X NA showed the best results.

| | | TEOS Wafer | |
|---|---|---|---|
| Number | Sample | Particle area (%) | Standard Deviation (%) |
| 1 | sample X control | 0.11 | 0.04 |
| 2 | sample X BA | 0.14 | 0.10 |
| 3 | sample X OA | 0.04 | 0.01 |
| 4 | sample X NA | 0.09 | 0.03 |
| 5 | sample X DA | 0.14 | 0.08 |
| 6 | sample X DDA | 0.18 | 0.05 |
| 7 | sample X SA | 0.21 | 0.10 |
| 8 | sample X SBA | 0.95 | 0.40 |
| 9 | sample X CA (comparative) | 1.27 | 0.40 |

The invention has been described in detail with particular reference to certain embodiments thereof, but it will be understood that variations and modifications can be effected within the spirit and scope of the invention.

The invention claimed is:

1. A composition comprising:
   a. water;
   b. an alkanolamine having from two to seven carbon atoms;
   c. a glycol ether;
   d. a pH adjustor; and
   e. a surface-active hydrophobic acid chosen from octanoic acid, dodecylbenzenesulfonic acid, and nonanoic acid.

2. The composition of claim 1, wherein the alkanolamine is chosen from aminoethylethanolamine, N-methylaminoethanol, aminoethoxyethanol, aminoethoxyethoxyethanol, methoxypropylamine, butoxyisopropylamine, 2-ethylhexylisopropoxyamine, ethanolpropylamine, ethylethanolamine, n-hydroxyethylmorpholine, aminopropyldiethanolamine, dimethylaminoethoxyethanol, diethanolamine, N-methyldiethanolamine, monoethanolamine, triethanolamine, 1-amino-2-propanol, 3-amino propanol, diisopropylamine, aminomethylpropanediol, N,N-dimethylaminomethylpropanediol, aminoethylpropanediol, N,N-dimethylaminoethylpropanediol, isopropylamine, 2-amino-1-butanol, aminomethylpropanol, aminodimethylpropanol, N,N-dimethylaminomethylpropanol, isobutanolamine, diisopropanolamine, 3-amino, 4-hydroxyoctane, 2-aminobutylanol, tris(hydroxymethyl)aminomethane, N,N-dimethyltris(hydroxymethyl)aminomethane, hydroxyproplyamine, benzylamine, hydroxyethyl amine, tris(hydroxyethyl)aminomethane, diglycolamine, and combinations thereof.

3. The composition of claim 2, wherein the alkanolamine is chosen from monoethanolamine, isopropanolamine, and diisopropanolamine.

4. The composition of claim 1, wherein the glycol ether possesses a methylene linking group of the formula —$(CH_2)_x$—, wherein x is an integer of from 2 to 6.

5. The composition of claim 1, wherein the glycol ether is chosen from diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, diethylene glycol phenylether, hexaethylene glycol monophenyl ether, propylene glycol methyl ether, dipropylene glycol methyl ether, tripropylene glycol methyl ether, dipropylene glycol dimethyl ether, dipropylene glycol ethyl ether, propylene glycol n-propyl ether, dipropylene glycol n-propyl ether, tripropylene glycol n-propyl ether, propylene glycol n-butyl ether, dipropylene glycol n-butyl ether, tripropylene glycol n-butyl ether, and dipropylene glycol phenyl ether, propylene glycol phenyl ether.

6. The composition of claim 5, wherein the glycol ether is chosen from triethylene glycol monobutyl ether, diethylene glycol monobutyl ether, ethylene glycol monobutyl ether, triethylene glycol monohexyl ether, diethylene glycol monohexyl ether, and ethylene glycol monohexyl ether.

7. The composition of claim 5, wherein the glycol ether is ethylene glycol monohexyl ether.

8. The composition of claim 1, wherein the pH adjustor is chosen from choline hydroxide and tetraethylammonium hydroxide.

9. The composition of claim 1, further comprising a corrosion inhibitor.

10. The composition of claim 9 wherein the corrosion inhibitor is chosen from phosphorous acid, hypophosphorous acid, sulfurous acid, diethyl hydroxylamine, hydroxylamine sulfate, sodium metabisulfite, potassium metabisulfite, ammonium metabisulfite, quaternary surfactants chosen from as N-alkyl-N-benzyl-N,N-dimethylammonium chloride, and 4-(3-phenylpropyl)pyridine, acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, succinic acid, tartaric acid, terephthalic acid, trimellitic acid, trimesic acid, tyrosine, valine, xylitol, oxalic acid, tannic acid, picolinic acid, 1,3-cyclopentanedione, catechol, pyrogallol, resorcinol, hydroquinone, cyanuric acid, barbituric acid, 1,2-dimethylbarbituric acid, pyruvic acid, propanethiol, benzohydroxamic acids, 2,5-dicarboxypryidine, 4-(2-hydroxyethyl)morpholine, N-aminoethylpiperazine (N-AEP), ethylenediaminetetraacetic acid, 1,2-cyclohexanediamine-N,N,N',N'-tetraacetic acid, N-(hydroxyethyl)-ethylenediaminetriacetic acid, iminodiacetic acid, 2-(hydroxyethyl)iminodiacetic acid, nitrilotriacetic acid, thiourea, 1,1,3,3-tetramethylurea, urea, urea derivatives, glycine, cysteine, glutamic acid, isoleucine, methionine, piperadine, N-(2-aminoethyl) piperadine, pyrrolidine, threonine, tryptophan, salicylic acid, p-toluenesulfonic acid, salicylhyroxyamic, 5-sulfosalicylic acid, triazole, aminotriazole, dimethylpropargyl alcohol, saccharine, and combinations thereof.

11. The composition of claim 9, wherein the corrosion inhibitor is chosen from ascorbic acid, L(+)-ascorbic acid, isoascorbic acid, ascorbic acid derivatives, sulfurous acid, ammonium sulfite, potassium sulfite, sodium sulfite, dopamine HCl, phosphorous acid, phosphinic acid, hypophosphorous acid, potassium metabisulfite, sodium metabisulfite, ammonium metabisulfite, potassium pyruvate, sodium pyruvate, ammonium pyruvate, formic acid, sodium formate, potassium formate, ammonium formate, dopamine, sulfur dioxide solution, and any combination thereof.

12. The composition of claim 9, wherein the corrosion inhibitor is chosen from ascorbic acid, phosphorous acid, hypophosphorous acid, sulfurous acid, diethyl hydroxylamine, hydroxylamine sulfate, sodium/ammonium/potassium metabisulfite and sulfite and quaternary surfactants chosen from as N-alkyl-N-benzyl-N,N-dimethylammonium chloride, and 4-(3-phenylpropyl)pyridine.

13. The composition of claim 1, further comprising a complexing agent.

14. The composition of claim 13, wherein the complexing agent is chosen from include phthalic acid, succinic acid, citric acid, tartaric acid, malic acid, gluconic acid, aspartic acid, arabitol, erythritol, glycerol, hydrogenated starch hydrolysates, isomalt, lactitol, maltitol, mannitol, sorbitol, xylitol, acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, ethylenediamine, oxalic acid, tannic acid, picolinic acid, 1,3-cyclopentanedione, catechol, pyrogallol, resorcinol, hydroquinone, cyanuric acid, barbituric acid, 1,2-dimethylbarbituric acid, pyruvic acid, propanethiol, benzohydroxamic acids, tetraethylenepentamine, 4-(2-hydroxyethyl)morpholine, N-aminoethylpiperazine, ethylenediaminetetraacetic acid, 1,2-cyclohexanediamine-N,N,N',N'-tetraacetic acid, N-(hydroxyethyl)-ethylenediaminetriacetic acid, iminodiacetic acid, 2-(hydroxyethyl)iminodiacetic acid, nitrilotriacetic acid, amino tris(methylene phosphoric acid), hydroxyethylidine diphosphonic acid, ethylenediamino tetrakis(methylene phosphoric acid), ethylenediamino pentakis(methylene phosphoric acid), thiourea, 1,1,3,3-tetramethylurea, urea, urea derivatives, glycine, cysteine, glutamic acid, isoleucine, methionine, piperadine, N-(2-aminoethyl) piperadine, pyrrolidine, threonine, tryptophan, salicylic acid, dipicolinic acid, p-toluenesulfonic acid, 5-sulfosalicylic acid, propane-1,2,3-tricarboxylic acid, butane-1,2,3,4-tetracarboxylic acid, pentane-1,2,3,4,5-pentacarboxylic acid, trimellitic acid, trimesinic acid, pyromellitic acid, mellitic acid, carboxylic acid group-containing oligomers and polymers derived from monomers that include one or more of acrylic acid, methacrylic acid, maleic acid, succinic acid, aspartic acid, 2-acrylamido-2-methyl-1-propanesulfonic, acrylamide, phosphonate methacrylamidopropyl trimethylammonium chloride, allyl halide, and combinations of thereof.

15. The composition of claim 1, further comprising a water-soluble or water-dispersible polymer.

16. The composition of claim 15, wherein the water-soluble or water-dispersible polymer is chosen from methacrylic acid homopolymer and copolymers with, acrylamidemethylpropane sulfonic acid and maleic acid; maleic acid/vinyl ether copolymer; poly(vinylpyrrolidone)/vinyl acetate; phosphonated polyethyleneglycol oligomers, poly(acrylic acid), poly(acrylamide), poly(vinyl acetate), poly(ethylene glycol), polypropylene glycol), poly(styrene sulfonic acid), poly(vinyl sulfonic acid), poly(vinyl phosphonic acid), poly(vinyl phosphoric acid), poly(ethyleneimine), poly(propyleneimine), polyallylamine, polyethylene oxide, polyvinyl pyrrolidone, PPG-PEG-PPG block copolymers, PEG-PPG-PEG block copolymers, poly(vinyl alcohol), poly(hydroxyethyl)acrylate, poly(hydroxyethyl)methacrylate, hydroxyethyl cellulose, methylhydroxyethyl cellulose, hydroxypropyl cellulose, methylhydroxypropyl cellulose, xanthan gum, potassium alginate, pectin, carboxymethylcellulose, glucosamine, poly(diallyldimethylammonium) chloride, poly(2-acrylamido-2-methyl-1-propanesulfonic acid), poly(styrenesulfonic acid), polyvinyl pyrrolidone, PVA-poly(2-acrylamido-2-methyl-1-propanesulfonic acid) copolymers, polyethyleneglycolated) methacrylate/acrylate copolymers, poly(2-methacryloxyethyltrimethylammonium chloride), and copolymers thereof, dimethylaminomethacrylate polymers and compolymers thereof, trimethylammonium methylmethacrylate polymers and copolymers thereof, dimethylaminomethacrylate polymers and compolymers thereof, trimethylammonium methylmethacrylate polymers and copolymers thereof, and combinations thereof.

17. The composition of claim 1, further comprising a biocide.

18. The composition of claim 1, further comprising a hydrogen-bonding compound.

19. A method of removing residue and contaminants from a microelectronic device having the residue and contaminants thereon, the method comprising contacting the microelectronic device with a cleaning composition for a time sufficient to at least partially clean the residue and contaminants from the microelectronic device, wherein the cleaning composition comprises:
  a. water;
  b. an alkanolamine having from two to seven carbon atoms;
  c. a glycol ether;
  d. a pH adjustor; and
  e. a surface-active hydrophobic acid.

* * * * *